(12) United States Patent
Zhang et al.

(10) Patent No.: US 10,923,881 B2
(45) Date of Patent: Feb. 16, 2021

(54) MONOLITHIC INTEGRATED SEMICONDUCTOR RANDOM LASER

(71) Applicant: Taiyuan University Of Technology, Taiyuan (CN)

(72) Inventors: Mingjiang Zhang, Taiyuan (CN); Jianzhong Zhang, Taiyuan (CN); Tianshuang Lv, Taiyuan (CN); Lijun Qiao, Taiyuan (CN); Yi Liu, Taiyuan (CN); Tong Zhao, Taiyuan (CN); Anbang Wang, Taiyuan (CN); Yuncai Wang, Taiyuan (CN)

(73) Assignee: Taiyuan University Of Technology

( * ) Notice: Subject to any disclaimer, the term of this patent is extended or adjusted under 35 U.S.C. 154(b) by 0 days.

(21) Appl. No.: 16/622,172

(22) PCT Filed: Aug. 27, 2018

(86) PCT No.: PCT/CN2018/000304
§ 371 (c)(1),
(2) Date: Dec. 12, 2019

(87) PCT Pub. No.: WO2019/095528
PCT Pub. Date: May 23, 2019

(65) Prior Publication Data
US 2020/0203919 A1 Jun. 25, 2020

(30) Foreign Application Priority Data
Nov. 16, 2017 (CN) .......................... 201711139130.3

(51) Int. Cl.
*H01S 5/30* (2006.01)
*H01S 5/042* (2006.01)
(Continued)

(52) U.S. Cl.
CPC .......... *H01S 5/3086* (2013.01); *H01S 5/0425* (2013.01); *H01S 5/1039* (2013.01);
(Continued)

(58) Field of Classification Search
CPC .... H01S 5/1003; H01S 3/0675; H01S 5/1228; H01S 5/2018; H01S 5/1039;
(Continued)

(56) References Cited

U.S. PATENT DOCUMENTS 5,455,836 A * 10/1995 Li .......................... H01S 5/0608
372/25
6,008,675 A * 12/1999 Handa ....................... H01S 5/12
327/96
(Continued)

FOREIGN PATENT DOCUMENTS

| CN | 103107484 A | 5/2013 |
| CN | 103229371 A | 7/2013 |

(Continued)

OTHER PUBLICATIONS

International Search Report for Application No. PCT/CN2018/000304 dated Nov. 13, 2018, 3 pages.
(Continued)

*Primary Examiner* — Yuanda Zhang
(74) *Attorney, Agent, or Firm* — Lerner, David, Littenberg, Krumholz & Mentlik, LLP

(57) ABSTRACT

A monolithic integrated semiconductor random laser comprising substrate, lower confinement layer on the substrate, active layer on the lower confinement layer, upper confinement layer on the active layer, strip-shaped waveguide layer longitudinally made in middle of the upper confinement layer, P$^+$ electrode layer divided into two segments and made on the waveguide layer and N$^+$ electrode layer on a back face of the lower confinement layer, wherein the two
(Continued)

segments correspond respectively to gain region and random feedback region. The random feedback region uses a doped waveguide to randomly feedback light emitted by the gain region and then generates random laser which is random in frequency and intensity. Further, the semiconductor laser is light, small, stable in performance and strong in integration.

3 Claims, 1 Drawing Sheet

(51) Int. Cl.
*H01S 5/10* (2021.01)
*H01S 5/20* (2006.01)
*H01S 5/34* (2006.01)
*H01S 5/22* (2006.01)
*H01S 3/067* (2006.01)
*H01S 5/12* (2021.01)

(52) U.S. Cl.
CPC .......... *H01S 5/2018* (2013.01); *H01S 5/2202* (2013.01); *H01S 5/34* (2013.01); *H01S 3/0675* (2013.01); *H01S 5/1228* (2013.01)

(58) Field of Classification Search
CPC .... H01S 5/0425; H01S 5/0265; H01S 5/3086; H01S 5/2202; H01S 5/34
See application file for complete search history.

(56) References Cited

U.S. PATENT DOCUMENTS

| | | | |
|---|---|---|---|
| 2003/0072342 A1* | 4/2003 | Yoshida | B82Y 20/00 372/46.01 |
| 2004/0114656 A1* | 6/2004 | Kim | H01S 5/06258 372/50.11 |
| 2009/0283746 A1* | 11/2009 | Chua | H01L 21/02389 257/13 |
| 2012/0225220 A1 | 9/2012 | Jose et al. | |
| 2015/0255944 A1* | 9/2015 | Li | H01S 3/06791 372/6 |

FOREIGN PATENT DOCUMENTS

| | | |
|---|---|---|
| CN | 102801091 B | 6/2014 |
| CN | 102931583 B | 6/2014 |
| CN | 104501843 A | 4/2015 |
| CN | 104953468 A | 9/2015 |
| CN | 107221829 A | 9/2017 |
| CN | 105006729 B | 10/2017 |
| CN | 107809058 A | 3/2018 |
| EP | 3148017 A1 | 3/2017 |

OTHER PUBLICATIONS

Lizarraga, et al., "Single-mode Er-doped fiber random laser with distributed Bragg grating feedback," Optics Express, Jan. 19, 2009, pp. 395-404, vol. 17, No. 2.

Shawki, et al., "Narrow Line Width Semiconductor Optical Amplifier Based Random Laser," InFiber Lasers XIV: Technology and Systems Feb. 22, 2017, pp. 100832C, vol. 10083, International Society for Optics and Photonics.

Turitsyn, et al., "Random distributed feedback fibre laser," Nature Photonics, published online Feb. 7, 2010, pp. 231-235, vol. 4.

Weili et al., CN Application No. ZI201510513253.3, filed on Aug. 20, 2015, titled "Random laser, random resonant cavity manufacture method and small particle concentration detection method". (Providing copy of patent published as utility model CN105006729B).

Xiangyang et al., CN Application No. ZL201210490468.4, filed on Nov. 26, 2012, titled "Electrically pumped random laser device based on dual SiO2—ZnO structure and preparation method and application thereof". (Providing copy of patent published as utility model CN102931583B).

Xu, et al., "Random Fabry-Perot resonator-based sub-kHz Brillouin fiber laser to improve spectral resolution in linewidth measurement," Optics Letters, May 1, 2015, pp. 1920-1923, vol. 40, No. 9.

Yingchun et al., CN Application No. ZL201210328766.3, filed on Sep. 6, 2012, titled "Random fiber laser". (Providing copy of patent published as utility model CN102801091B).

Xu, et al., Time-delay signature suppression in a chaotic semiconductor laser by fiber random grating induced distributed feedback, Optics Letters, Mar. 2017, 17 pages.

Xu, et al., Time-delay signature suppression in a chaotic semiconductor laser by fiber random grating induced random distributed feedback, Optics Letters, Oct. 2017, pp. 4107-4110, vol. 42, No. 20.

* cited by examiner

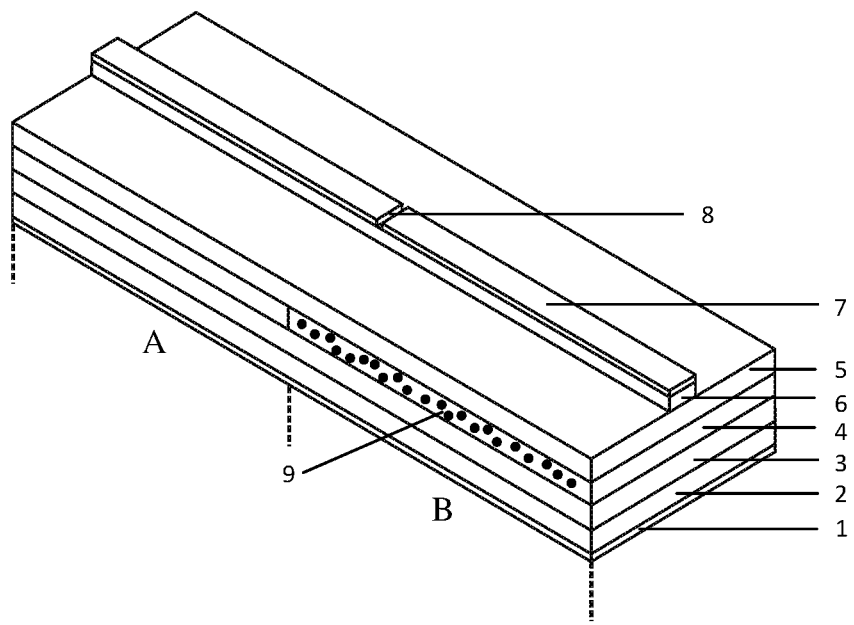

MONOLITHIC INTEGRATED SEMICONDUCTOR RANDOM LASER

CROSS REFERENCE TO RELATED APPLICATIONS

The present application is a national phase entry under 35 U.S.C. § 371 of International Application No. PCT/CN2018/000304, filed Aug. 27, 2018, which claims priority from Chinese Patent Application No. 201711139130.3 filed Nov. 16, 2017, all of which are hereby incorporated herein by reference.

TECHNICAL FIELD

The present disclosure relates to the field of semiconductor lasers, and in particular to a monolithic integrated semiconductor random laser.

BACKGROUND

In recent years, random lasers have been extensively studied due to their special feedback mechanisms and broad application prospects. In a conventional laser, an optical cavity determines the mode of laser, i.e. determines the emitting frequency of the laser. The random optical feedback of the random laser forms a random resonant cavity, which replaces the optical cavity in the conventional laser, and both frequency and intensity of laser emitted by the semiconductor laser are random.

In 2009, E. I. Chaikina et al. of Mexico proposed an Er/Ge co-doped single-mode fiber random laser based on distributed Bragg grating feedback (Lizä r N, Puente N P, Chaikina E I, et al. Single-mode Er-doped fiber random laser with distributed Bragg grating feedback [J]. Optics Express, 2009, 17(2):395-404), which uses a mask technology to etch Bragg grating in doped fiber, increasing an effective length of the resonant cavity through a large number of randomly distributed Bragg gratings, and improving the efficiency and frequency selectivity of the system in this way.

In 2010, Sergei K. Turitsyn et al. proposed a random distributed optical feedback fiber laser (Turitsyn S K, Babin S A, EI-Taher A E, et al. Random distributed feedback fibre laser [J]. Optics Express, 2012, 20(27): 28033). It amplifies by using a Rayleigh backscattering and a Raman scattering generated by injecting pump light into the fiber, to produce a random laser.

In 2012, Beijing University of Chemical Technology disclosed a random fiber laser system using an all-fiber connection structure, which uses a fiber laser as a pumping light source and performs amplification by using a Rayleigh backscattered light in the fiber to form a laser (see Chinese Patent: Random Fiber Laser, Patent Number: ZL201210328766.3). The Rayleigh scattered light generated when the light propagates in the fiber is weak, and in the feedback process, a portion of the feedback light is lost due to the length of the fiber, the fiber material and the structural defects of the discrete device(s).

In 2013, Xiangyang Ma et al. proposed an electrically pumped random laser device based on dual $SiO_2$—ZnO structure (see Chinese Patent: Electrically pumped random laser device based on dual $SiO_2$—ZnO structure and preparation method and application thereof, Patent Number: 201210490468.4). A first ZnO thin film, a first $SiO_2$ thin film, a second ZnO thin film, a second $SiO_2$ thin film and a translucent electrode are sequentially deposited on the front face of a silicon substrate from bottom to top, and an ohmic contact electrode is deposited on a back face of the silicon substrate, thus obtaining the electrically pumped random laser device based on the dual $SiO_2$—ZnO structure, the threshold current of which is obviously reduced and the light output power of which is obviously improved.

In 2015, the University of Electronic Science and Technology of China disclosed a random laser (see Chinese Patent: Random laser, random resonant cavity manufacture method and small particle concentration detection method, Patent Number: 201510513253.3), wherein the inner wall of the random laser resonant cavity is coated with the random medium film formed by mixing the $TiO_2$ nanoparticles and the ultraviolet glue, under the effect of multiple scattering, realizing a controllable output of the random laser. The invention has a complicated process and high technical requirements, which will have a great influence on the generation of the final random laser.

In 2015, the Bao Xiaoyi Research Group of the University of Ottawa proposed a new type of F-P cavity Brillouin random laser (Xu Y, Xiang D, Ou Z, et al. Random Fabry-Perot resonator-based sub-kHz Brillouin fiber laser to improve Spectral resolution in linewidth measurement [J]. Optics Letters, 2015, 40 (9): 1920), and experimentally verified that the random laser improved the spectral resolution in linewidth measurement and achieved linewidth characterization accuracy lower than 0.9 KHz. Due to the small Rayleigh scattering coefficient in a single mode fiber, such a random laser requires a long (tens of kilometers) single mode fiber.

In 2017, Heba A. Shawki et al. proposed a random fiber laser (Shawki H A, Kotb H E, Khalil D. Narrow line width semiconductor optical amplifier based random laser [C]// SPIE LASE. 2017: 100832C), wherein a semiconductor optical amplifier (SOA) is a laser gain medium and uses a 1 km single-mode fiber to provide a Rayleigh backscattering instead of a conventional optical resonant cavity to generate a random laser.

However, the above-mentioned random lasers are all random lasers built by using the Rayleigh scattering in electroluminescent materials or optical fibers and external discrete components, which is bulky, susceptible to environmental influence, and unstable in output. In order to really realize the practicality and industrialization of random lasers, it is necessary to develop an integrated random laser with small size and stable performance.

SUMMARY

The present disclosure provides a monolithic integrated semiconductor random laser. The present invention adopts a doped waveguide, and a beam is randomly fed back in the doped waveguide to form a random resonant cavity, and then both frequency and intensity of laser emitted and amplified by the random laser are stochastic, and the manufacture is simple and the integration is easy. The adoption of monolithic integration structure brings advantages of being light in weight, small in volume, stable in performance and strong in integration.

The present disclosure discloses a monolithic integrated semiconductor random laser composed of a gain region and a random feedback region, specifically comprising:
  a substrate;
  a lower confinement layer made on the substrate;
  an active layer made on the lower confinement layer;
  an upper confinement layer made on the active layer;
  a strip-shaped waveguide layer longitudinally made in the middle of the upper confinement layer;

a P⁺ electrode layer divided into two segments by an isolation groove and made on the waveguide layer; and an N⁺ electrode layer made on a back face of the lower confinement layer, wherein the two segments of the P⁺ electrode layer correspond respectively to the gain region and the random feedback region.

The gain region provides a gain for a whole chip, and a portion of the active layer corresponding to the gain region is a multiple quantum well material; a length of the gain region is 300±50 μm;

the random feedback region performs random feedback on the light emitted by the gain region, and a portion of the active layer corresponding to the random feedback region is a bulk material; a portion of the active layer corresponding to the random feedback region introduces doping; and a length of the random feedback region is 300±50 μm.

The present disclosure adopts the monolithic integration structure, achieving advantages of being light in weight, small in volume, stable in performance and strong in integration, which has important significance and value for promoting the application of random lasers in scientific research, basic application and engineering technology.

BRIEF DESCRIPTION OF THE DRAWINGS

FIG. 1 is a structural schematic diagram of the present disclosure.

REFERENCE SIGNS LIST

1—N⁺ electrode layer;
2—Substrate;
3—Lower confinement layer;
4—Active layer;
5—Upper confinement layer;
6—Waveguide layer;
7—P⁺ electrode layer;
8—Isolation groove;
9—Doped waveguide;
A—Gain region;
B—Random feedback region.

DESCRIPTION OF EMBODIMENTS

Referring to FIG. 1, the present disclosure discloses a monolithic integrated semiconductor random laser composed of a gain region A and a random feedback region B. Specifically, the monolithic integrated semiconductor random laser comprises:

a substrate 2;

a lower confinement layer 3 for limiting carriers and photons in the vertical direction, made on the substrate 2 and having a thickness of 80 to 200 nm;

an active layer 4 for generating photons and amplification by stimulated radiation, made on the lower confinement layer 3 and having a thickness of 80 to 200 nm, wherein a portion of the active layer corresponding to the gain region A is a multiple quantum well material, and the gain peak wavelength corresponds to 1310 nm or 1550 nm; a portion of the active layer corresponding to the random feedback region B is a bulk material;

an upper confinement layer 5 for limiting carriers and photons in the vertical direction, made on the active layer 4, and functioning together with the lower confinement layer 3;

a strip-shaped waveguide layer 6 longitudinally made in the middle of the upper confinement layer and its function being mainly to guide light;

a P⁺ electrode layer 7 made on the waveguide layer 6 and divided into two segments by an isolation groove 8, wherein the isolation groove 8 is made into a high resistance region by injecting He⁺ ions or etching, thus realizing electrical isolation between each electrode;

an N⁺ electrode layer 1 made on a back face of the substrate 2, wherein the two segments of P⁺ electrode layer 7 respectively correspond to the gain region A and the random feedback region B;

wherein the gain region A provides a gain for a whole chip, and a portion of the active layer 4 corresponding to the gain region A is a multiple quantum well material; a length of the gain region is 300±50 μm;

wherein the random feedback region B performs random feedback on light emitted by the gain region A, and a portion of the active layer 4 corresponding to the random feedback region is a bulk material and introduces a doped waveguide 9; and a length of the random feedback region B is 300±50 μm;

wherein an end face of the monolithic integrated semiconductor random laser on the side of the gain region A is a natural dissociation end face, and its reflectivity is 0.32. an end face on the side of the random feedback region B is a light-emitting end face, and its reflectance can be reduced to 0.1 if an anti-reflection coating is required to be plated so as to increase the light output power, and a random laser is finally output from the end surface.

The present disclosure uses a doped waveguide to form a random resonant cavity, and provides a new type of monolithic integrated random laser. The beam generates random feedback in the doped waveguide to form a random resonant cavity, and the random feedback of the doped waveguide to the incident light determines the property of the irradiated laser, therefore, both frequency and intensity of laser emitted by the random laser are random. And the adoption of monolithic integration structure brings advantages of being light in weight, small in volume, stable in performance and strong in integration.

In the above specific embodiment, a monolithic integrated semiconductor random laser of the present disclosure is further described in detail, and it should be understood that the above description is only a specific embodiment of the present disclosure and is not intended to limit the present disclosure, and any modifications, equivalent substitutions, improvements, etc., made within the spirit and scope of the present invention shall be included within the scope of the present invention.

The invention claimed is:

1. A monolithic integrated semiconductor random laser comprising:

a substrate;
a lower confinement layer made on the substrate;
an active layer made on the lower confinement layer;
an upper confinement layer made on the active layer;
a strip-shaped waveguide layer longitudinally formed in the middle of the upper confinement layer;
a P⁺ electrode layer divided into two segments by an isolation groove, and made on the waveguide layer; and
an N⁺ electrode layer made on a back face of the lower confinement layer,
wherein the two segments of P⁺ electrode layer respectively correspond to a gain region and a random feedback region, and wherein a portion of the active layer corresponding to the random feedback region introduces doping to form a random resonant cavity.

2. The monolithic integrated semiconductor random laser of claim 1, wherein
the gain region provides a gain for a whole chip, and a portion of the active layer corresponding to the gain region is a multi-quantum well material; and
a length of the gain region is 300±50 μm.

3. The monolithic integrated semiconductor random laser of claim 1, wherein
the random feedback region randomly feeds back light emitted by the gain region, and the portion of the active layer corresponding to the random feedback region is a bulk material; and
a length of the random feedback region is 300±50 μm.

* * * * *